US010069188B1

(12) United States Patent
Chou et al.

(10) Patent No.: US 10,069,188 B1
(45) Date of Patent: Sep. 4, 2018

(54) COMMUNICATION DEVICE

(71) Applicant: JIENG TAI INTERNATIONAL ELECTRONIC CORP., New Taipei (TW)

(72) Inventors: Yu-Pang Chou, New Taipei (TW); Chih-Kung Chang, New Taipei (TW); Jyh-Hui Chang, New Taipei (TW)

(73) Assignee: JIENG TAI INTERNATIONAL ELECTRONIC CORP., New Taipei (TW)

( * ) Notice: Subject to any disclaimer, the term of this patent is extended or adjusted under 35 U.S.C. 154(b) by 0 days.

(21) Appl. No.: 15/654,732

(22) Filed: Jul. 20, 2017

(30) Foreign Application Priority Data

May 22, 2017 (TW) ............................. 106116915 A

(51) Int. Cl.
*G11C 8/00* (2006.01)
*H01Q 1/22* (2006.01)
*H01Q 21/28* (2006.01)
*H01Q 21/30* (2006.01)
*H01Q 9/14* (2006.01)

(52) U.S. Cl.
CPC ............... *H01Q 1/22* (2013.01); *H01Q 21/28* (2013.01); *H01Q 21/30* (2013.01); *H01Q 9/145* (2013.01)

(58) Field of Classification Search
CPC . H03H 7/482; H04L 27/2601; H04L 12/5692; H04L 1/0025; H05K 1/0237; H05K 1/144; H05K 1/18; G08C 17/02; G08C 2201/40; G08C 23/04; G11C 8/16; G11C 11/419; G11C 7/22; G11C 11/406; G11C 11/412; G11C 8/10; G11C 11/413; G11C 5/063; G11C 7/1075; G11C 7/18; G11C 8/18; G11C 11/4091
USPC ......... 398/25, 116, 115, 22, 9, 140, 162, 58; 365/230.05, 189.04, 230.06, 189.05, 203, 365/222, 154, 189.07, 189.11, 230.01, 365/230.03, 233.11, 63
See application file for complete search history.

(56) References Cited

U.S. PATENT DOCUMENTS

2007/0297398 A1* 12/2007 Loyet ........................ H01P 5/12
370/382

FOREIGN PATENT DOCUMENTS

TW 201607173 A 2/2016
TW 201607179 A 2/2016

* cited by examiner

*Primary Examiner* — Thong Q Le
(74) *Attorney, Agent, or Firm* — CKC & Partners Co., Ltd.

(57) ABSTRACT

A communication device includes a first connector, a first radio frequency unit, a first transmission line and a first antenna. The first radio frequency (RF) unit is connected to the first connector, the first transmission line has a first terminal and a second terminal, the first terminal of the first transmission line is connected to the first connector, and the first antenna is contacted and electrically coupled to the second terminal of the first transmission line. The first RF unit is configured to generate a first RF signal. The first terminal of the first transmission line is configured to receive the first RF signal, and the first transmission line is configured to transmit the first RF signal from the first terminal of the first transmission line to the second terminal of the first transmission line. The first antenna is configured to send the first RF signal.

10 Claims, 3 Drawing Sheets

COMMUNICATION DEVICE

RELATED APPLICATIONS

This application claims priority to Taiwan Application Serial Number 106116915, filed May 22, 2017, which is herein incorporated by reference.

BACKGROUND

Field of Invention

The present invention relates to a communication device. More particularly, the present invention relates to a communication device with a small sized antenna connector.

Description of Related Art

As communication technology develops, multiple antennas are often disposed in a mobile electronic device to receive and send signals in different bands. Corresponding to multiple antennas, disposing multiple transmission lines is in order to respectively transmit antenna signals. Therefore, a volume of a connector connected to the transmission lines and the antennas is also increased. However, a volume of the present mobile electronic device has a trend of being light and thin, people in the related art therefore have urgency to solve the problem of disposing multiple antennas in the limited space.

SUMMARY

An aspect of the present disclosure is to provide a communication device. The communication device includes a first connector, a first radio frequency (RF) unit, a first transmission line and a first antenna. The first RF unit is connected to the first connector. The first transmission line has a first terminal and a second terminal. The first terminal of the first transmission line is connected to the first connector. The first antenna is contacted and electrically connected to the second terminal of the first transmission line. The first RF unit is configured to generate a first RF signal. The first terminal of the first transmission line is configured to receive the first RF signal. The first transmission line is configured to transmit the first RF signal from the first terminal of the first transmission line to the second terminal of the first transmission line. The first antenna is configured to send the first RF signal.

In an embodiment, the communication device further includes a second connector, a second RF unit, a second transmission line, a second antenna and a ground terminal. The second RE unit is connected to the first connector. The second transmission line has a first terminal and a second terminal. The first terminal of the second transmission line is connected to the first connector, and the second terminal of the second transmission line is connected to the second connector. The second antenna is electrically connected to the second terminal of the second transmission line through the second connector. The ground terminal is electrically connected to the first antenna. The second RF unit is configured to generate a second RF signal. The first terminal of the second transmission line is configured to receive the second RF signal. The second transmission line is configured to transmit the second RF signal from the first terminal of the second transmission line to the second terminal of the second transmission line. The second antenna is configured to send the second RF signal. The first antenna is further configured to be coupled with the second antenna.

In an embodiment, an impedance of the second transmission line is 50 ohm.

In an embodiment, the first connector and the second connector are disposed on a first flexible printed circuit board.

In an embodiment, the first connector is disposed on a first flexible printed circuit board, and the second connector is disposed on a second flexible printed circuit board.

In an embodiment, a thickness of the first flexible printed circuit board and a thickness of the second flexible printed circuit board are within a range of 0.05 mm to 1 mm.

In an embodiment, the first antenna is a planar inverted F antenna (PIFA).

In an embodiment, the first antenna is a monopole antenna.

In an embodiment, the first antenna is a loop antenna.

In an embodiment, an impedance of the first transmission line is 50 ohm.

In conclusion, the present disclosure is adaptable to multiple antenna application, the first antenna (or the third antenna) can directly send the RF signal generated by the first RE unit (or the third RF unit), and can also be a coupling antenna to be coupled with the second antenna. Therefore, the volume of the second connector can be effectively saved to meet a design trend of light and thin mobile electronic devices.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise indicated, all numbers expressing quantities, conditions, and the like in the instant disclosure and claims are to be understood as modified in all instances by the term "about." The term "about" refers, for example, to numerical values covering a range of plus or minus 20% of the numerical value. The term "about" preferably refers to numerical values covering range of plus or minus 10% (or most preferably, 5%) of the numerical value. The modifier "about" used in combination with a quantity is inclusive of the stated value.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
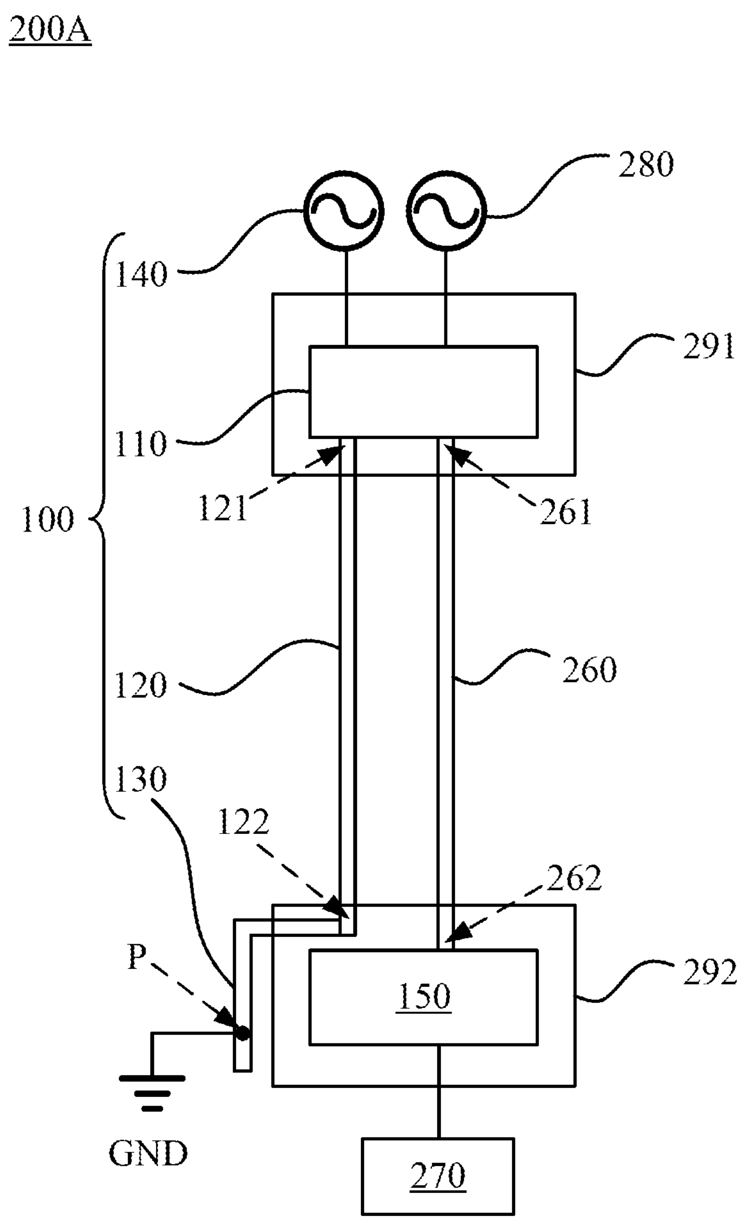
FIG. 1 is a schematic diagram of a communication device according to an embodiment of the present disclosure.

Reference is made to FIG. 1. FIG. 1 is a schematic diagram of a communication device 100 according to an embodiment of the present disclosure. The communication device 100 includes a first connector 110, a first radio frequency (RF) unit 140, a first transmission line 120 and a first antenna 130. The first RF unit 140 is connected to the first connector 110. The first transmission line 120 has a first terminal 121 and a second terminal 122, the first terminal 121 is connected to the first connector 110, and the second terminal 122 is contacted and electrically connected to the first antenna 130. The first RF unit 140 is configured to generate a first RF signal. The first transmission line 120 is configured to receive the first RF signal through the first terminal 121, and transmit the first RF signal from the first terminal 121 to the second terminal 122 to further transmit the first RF signal to the first antenna 130. The first antenna 130 is configured to send the first RF signal.

It should be noted that generally a transmission line of an antenna is disposed between the first connector 110 and the second connector 150 in a mobile electronic device to transmit the RF signal between the RF unit and the antenna. In contrast, in the present disclosure, the second terminal 122 of the first transmission line 120 is directly electrically connected to the first antenna 130 for sending the first RF signal and not necessary to be connected to the second connector 150. Therefore, a volume of the second connector 150 is not necessary to be increased according to the disposed first antenna 130.

As a result, the communication device 100 is adaptable to multiple antenna application, and effectively saves the volume of the second connector 150 to meet a design trend of light and thin mobile electronic devices.

Reference is made to FIG. 1. Configuration of a communication device 200A is substantially the same as configuration of the communication device 100 except for the second connector 150, a second RF unit 280, a second transmission line 260, a second antenna 270 and a ground terminal GND. The second transmission line 260 has a first terminal 261 and a second terminal 262, the first terminal 261 is connected to the first connector 110, and the second terminal 262 is connected to the second connector 150. The second RF unit 280 is connected to the first connector 110. The ground terminal GND is electrically connected to the first antenna 130 at a node P.

The second RF unit 280 is configured to generate the second RF signal and send the second RF signal to the first terminal 261 of the second transmission line 260 through the first connector 110. The second transmission line 260 is configured to receive the second RF signal through the first terminal 261, and transmit the second RF signal from the first terminal 261 to the second terminal 262 to further transmit the second RF signal to the second antenna 270. The second antenna 270 is configured to send the second RF signal.

It should be noted that the first antenna 130 electrically connected to the ground terminal GND is further configured to be coupled with the second antenna 270. Specifically, when the second antenna 270 sends the second RF signal and the first RF unit 140 is turned off or not connected to the first transmission line 120, the first antenna 130 may be coupled with the second antenna 270 to generate a resonant mode.

In FIG. 1, a position of the node P where the ground terminal GND is connected to first antenna 130 is merely for example. In an embodiment, the position of the node P may be adjusted according to actual demand. Therefore, variant positions of the node P are covered by the present disclosure.

Figure 2:
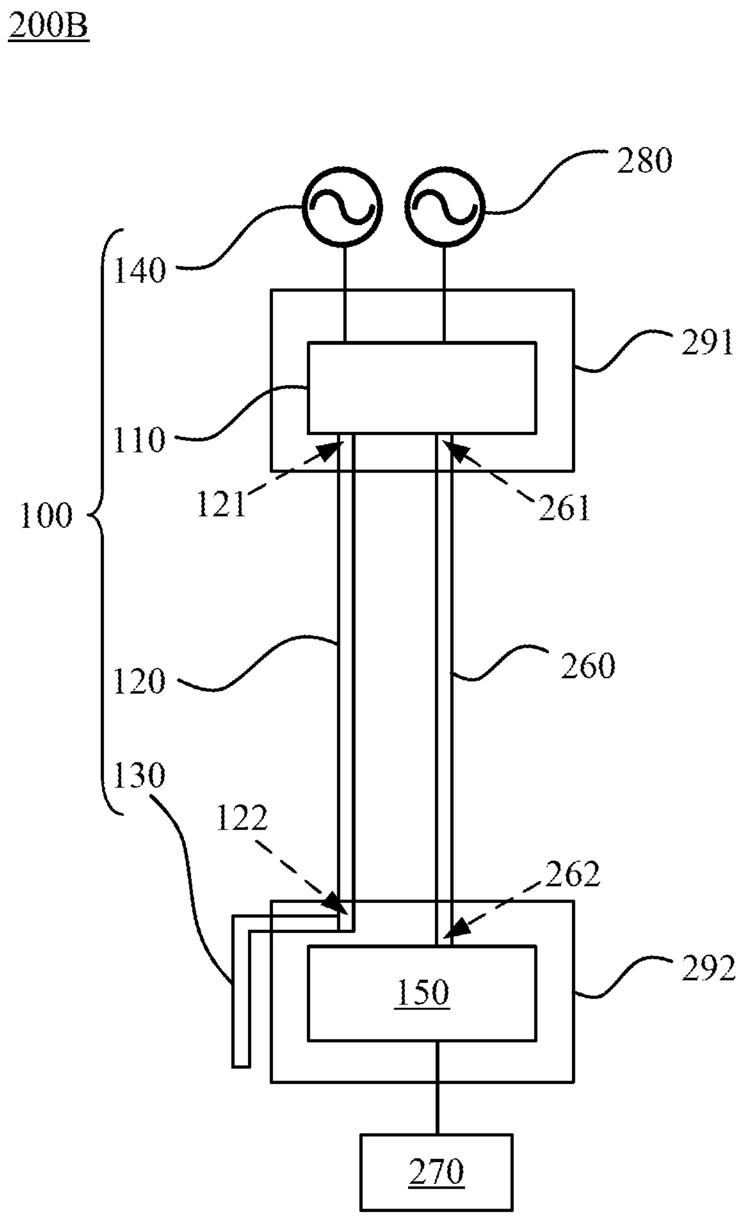
FIG. 2 is a schematic diagram of a communication device according to an embodiment of the present disclosure.

Alternatively, in another embodiment, as shown by a communication device 200B in FIG. 2, the first antenna 130 is not connected to the ground terminal GND, and the second antenna 270 is connected to the ground terminal (not shown).

It should be noted that a position of the first antenna 130 may be adjusted according to actual demand. For example, the first antenna 130 may extend to another side of the second transmission line 260, and not limited to the position shown in FIG. 1.

In an embodiment, the first connector 110 is disposed on a flexible printed circuit board 291, and the second connector 150 is disposed on a flexible printed circuit board 292. The flexible printed circuit board 291 and the flexible printed circuit board 292 are different printed circuit boards. Moreover, material of the flexible printed circuit board 291 and material of the flexible printed circuit board 292 may be the same or different.

In another embodiment, the first connector 110 and the second connector 150 are disposed on the same flexible printed circuit board (not shown).

In an embodiment, thicknesses of the flexible printed circuit boards 291 and 292 are within a range about 0.05 mm to about 0.1 mm.

Figure 3:
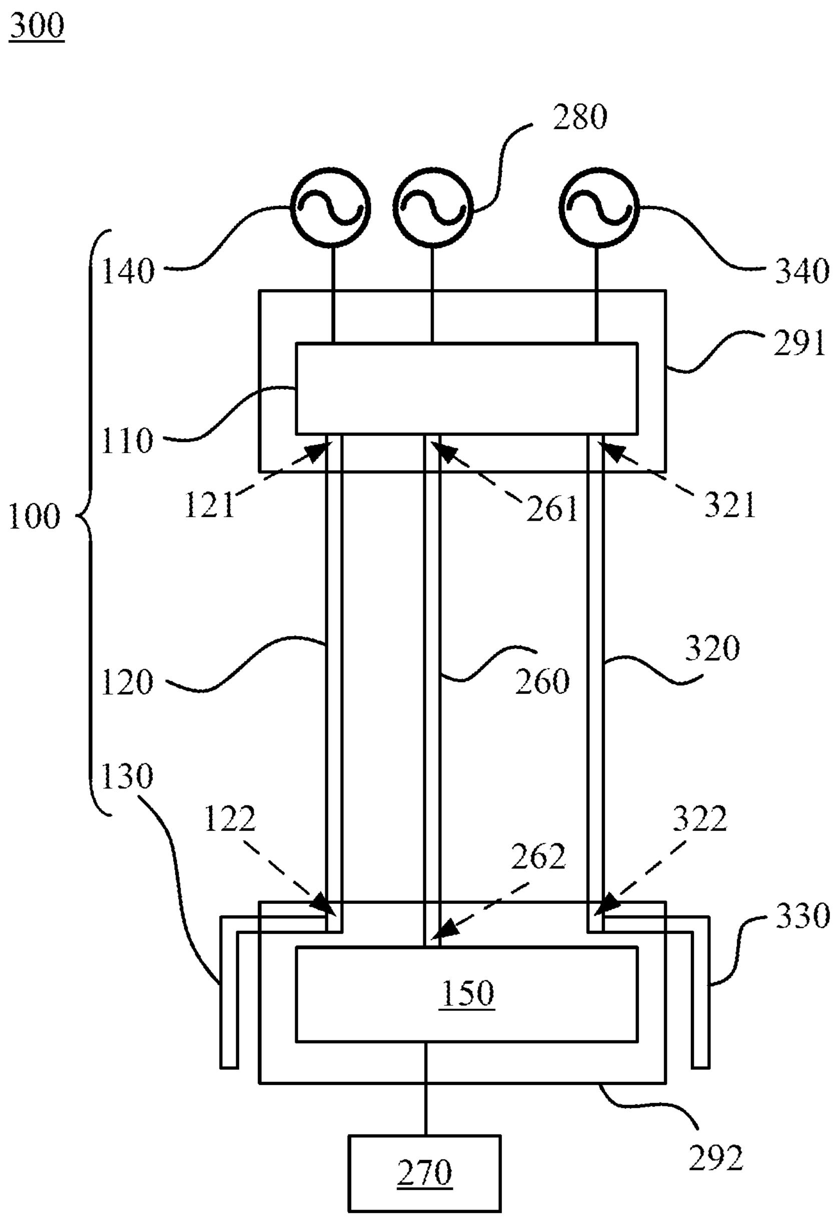
FIG. 3 is a schematic diagram of a communication device according to an embodiment of the present disclosure.

Reference is made to FIG. 3. FIG. 3 is a schematic diagram of a communication device 300 according to an embodiment of the present disclosure. Configuration of the communication device 300 is substantially the same as configuration of the communication device 200B except for a third RF unit 340, a third transmission line 320 and a third antenna 330. The third transmission line 320 has a first terminal 321 and a second terminal 322, the first terminal 321 is connected to the first connector 110, and the second terminal 322 is contacted and electrically connected to the third antenna 330. The third RF unit 340 is configured to generate a third RF signal. The third transmission line 320 is configured receive the third RF signal to through the first terminal 321, and transmit the third RE signal from the first terminal 321 to the second terminal 322 to further transmit the third RF signal to the third antenna 330. The third antenna 330 is configured to send the third RE signal.

As aforementioned, in the present disclosure, the second terminal 322 of the third transmission line 320 is directly electrically connected to the third antenna 330 for sending the third RF signal and not necessary to be connected to the second connector 150. Therefore, a volume of the second connector 150 is not necessary to be increased according to the disposed third antenna 330.

It should be noted that the third antenna 330 may be also electrically connected to the ground terminal (not shown) to be coupled with the second antenna 270 to generate a resonant mode.

As a result, the disposed third transmission line 320 and the third antenna 330 can flexibly increase a number of antennas, effectively save the volume of the second connector 150, and are adaptable to a multiple-input multiple-output (MIMO) system.

In practice, the first antenna 130, the second antenna 270 and the third antenna 330 may be planar inverted F antennas (PIFA), monopole antennas or loop antennas.

The aforementioned implementation of the first antenna 130 and the second antenna 270 are merely for example. Another antenna adaptable to the communication device 100 is also covered by the present disclosure.

In some embodiments, the first antenna 130 and the second antenna 270 may operate in a WiFi band, a global positioning system (GPS) band, a third generation (3G) band, a long term evolution (LTE) B5 band or B7 band.

The aforementioned bands that may be operated by the first antenna 130 and the second antenna 270 are merely for example. Other bands adaptable to the above antenna and bands that are developed in the future are also covered by the present disclosure.

In some embodiments, impedances of the first transmission line 120 and the second transmission line 260 may be about 50 ohm. The above impedance value of the first transmission line 120 and the second transmission line 260 is merely for example. Another impedance value of the first transmission line 120 and the second transmission line 260 are also covered by the present disclosure.

In conclusion, the present disclosure is adaptable to multiple antenna application, the first antenna 130 (or the third antenna 330) can directly send the RF signal generated by the first RF unit 140 (or the third RF unit 340), and can also be a coupling antenna to be coupled with the second antenna 270. Therefore, the volume of the second connector 150 can be effectively saved to meet a design trend of light and thin mobile electronic devices.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A communication device disposed in a mobile electronic device, comprising:

a first connector disposed in the mobile electronic device;

a first radio frequency (RF) unit disposed in the mobile electronic device, connected to the first connector and configured to generate a first RF signal;

a first transmission line disposed in the mobile electronic device, having a first terminal and a second terminal, wherein the first terminal of the first transmission line is connected to the first connector and configured to receive the first RF signal, and the first transmission line is configured to transmit the first RF signal from the first terminal to the second terminal through the first transmission line; and a first antenna, contacted and electrically connected to the second terminal of the first transmission line, wherein the first transmission line only transmits the first RF signal to the first antenna to send.

2. The communication device of claim 1, further comprising:

a second connector disposed in the mobile electronic device;

a second RF unit disposed in the mobile electronic device, connected to the first connector and configured to generate a second RF signal;

a second transmission line disposed in the mobile electronic device, having a first terminal and a second terminal, wherein the first terminal of the second transmission line is connected to the first connector and configured to receive the second RF signal, the second terminal of the second transmission line is connected to the second connector, and the second transmission line is configured to transmit the second RF signal from the first terminal to the second terminal through the second transmission line;

a second antenna, electrically connected to the second terminal of the second transmission line through the second connector, and the second transmission line only transmits the second RF signal to the second antenna; and a ground terminal, electrically connected to the first antenna, wherein the first antenna is further configured to be coupled with the second antenna.

3. The communication device of claim 2, wherein an impedance of the second transmission line is 50 ohm.

4. The communication device of claim 2, wherein the first connector and the second connector are disposed on a first flexible printed circuit board.

5. The communication device of claim 2, wherein the first connector is disposed on a first flexible printed circuit board, and the second connector is disposed on a second flexible printed circuit board.

6. The communication device of claim 5, wherein a thickness of the first flexible printed circuit board and a thickness of the second flexible printed circuit board are within a range of 0.05 mm to 1 mm.

7. The communication device of claim 1, wherein the first antenna is a planar inverted F antenna (PIFA).

8. The communication device of claim 1, wherein the first antenna is a monopole antenna.

9. The communication device of claim 1, wherein the first antenna is a loop antenna.

10. The communication device of claim 1, wherein an impedance of the first transmission line is 50 ohm.

* * * * *